United States Patent
Nonaka

(10) Patent No.: US 11,282,727 B2
(45) Date of Patent: Mar. 22, 2022

(54) CONTROL DEVICE OF SUBSTRATE PROCESSING APPARATUS AND CONTROL METHOD OF SUBSTRATE PROCESSING APPARATUS

(71) Applicant: Tokyo Electron Limited, Tokyo (JP)

(72) Inventor: Jun Nonaka, Kumamoto (JP)

(73) Assignee: TOKYO ELECTRON LIMITED, Tokyo (JP)

(*) Notice: Subject to any disclaimer, the term of this patent is extended or adjusted under 35 U.S.C. 154(b) by 226 days.

(21) Appl. No.: 16/658,428

(22) Filed: Oct. 21, 2019

(65) Prior Publication Data

US 2020/0135515 A1 Apr. 30, 2020

(30) Foreign Application Priority Data

Oct. 26, 2018 (JP) .............................. JP2018-201548

(51) Int. Cl.
*H01L 21/67* (2006.01)
*G05B 19/418* (2006.01)

(52) U.S. Cl.
CPC .. *H01L 21/67253* (2013.01); *G05B 19/41875* (2013.01); *H01L 21/6708* (2013.01); *G05B 2219/32177* (2013.01); *G05B 2219/32368* (2013.01); *G05B 2219/45031* (2013.01)

(58) Field of Classification Search
CPC ........... G05B 2219/32368; G05B 2219/45031; H01L 21/67248; H01L 21/67253
See application file for complete search history.

(56) References Cited

U.S. PATENT DOCUMENTS

| | | | | |
|---|---|---|---|---|
| 2004/0138773 A1* | 7/2004 | Tomoyasu | ....... | G05B 19/41875 700/108 |
| 2005/0244047 A1* | 11/2005 | Kern | ..................... | G06T 7/0004 382/141 |
| 2007/0095788 A1* | 5/2007 | Hoffman | ........... | H01J 37/32174 216/59 |
| 2008/0110569 A1* | 5/2008 | Miya | ................. | H01J 37/32972 156/345.35 |
| 2008/0216956 A1* | 9/2008 | Nakamoto | ........ | H01J 37/32935 156/345.25 |
| 2008/0294280 A1* | 11/2008 | Okita | .................. | G03F 7/70625 700/108 |
| 2008/0318347 A1* | 12/2008 | Yasuda | ................... | H01L 22/20 438/14 |
| 2012/0310403 A1* | 12/2012 | Morisawa | ......... | H01J 37/32972 700/121 |

(Continued)

FOREIGN PATENT DOCUMENTS

JP 2015-211201 A 11/2015

*Primary Examiner* — Jaehwan Oh
(74) *Attorney, Agent, or Firm* — Abelman, Frayne & Schwab

(57) ABSTRACT

A control device of a substrate processing apparatus includes a reading unit, an estimation unit, a comparison unit, and a correction unit. The reading unit reads out a reference processing condition for processing a substrate. The estimation unit estimates an actual processing condition when the substrate is processed. The comparison unit compares the reference processing condition and the actual processing condition with each other. The correction unit corrects a processing condition for the substrate based on a comparison result in the comparison unit.

15 Claims, 14 Drawing Sheets

(56) References Cited

U.S. PATENT DOCUMENTS

| | | | |
|---|---|---|---|
| 2014/0261172 A1* | 9/2014 | Ito | H01L 21/67178 118/712 |
| 2016/0091892 A1* | 3/2016 | Okita | G06T 7/74 700/121 |
| 2019/0237337 A1* | 8/2019 | Matsui | H01L 22/26 |

* cited by examiner

CONTROL DEVICE OF SUBSTRATE PROCESSING APPARATUS AND CONTROL METHOD OF SUBSTRATE PROCESSING APPARATUS

CROSS-REFERENCE TO RELATED APPLICATIONS

This application is based on and claims priority from Japanese Patent Application No. 2018-201548 filed on Oct. 26, 2018 with the Japan Patent Office, the disclosure of which is incorporated herein in its entirety by reference.

TECHNICAL FIELD

Embodiments disclosed herein relate to a control device of a substrate processing apparatus and a control method of the substrate processing apparatus.

BACKGROUND

In the related art, there is known a technique of processing a substrate such as a semiconductor wafer (hereinafter, also referred to as a wafer) with, for example, a processing liquid (see, e.g., Japanese Patent Laid-Open Publication No. 2015-211201).

SUMMARY

According to an aspect of the present disclosure, a control device of a substrate processing apparatus includes a reading unit, an estimation unit, a comparison unit, and a correction unit. The reading unit reads out a reference processing condition for processing a substrate. The estimation unit estimates an actual processing condition when the substrate is processed. The comparison unit compares the reference processing condition and the actual processing condition with each other. The correction unit corrects a processing condition of the substrate based on a comparison result in the comparison unit.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, embodiments of a control device of a substrate processing apparatus and a control method of the substrate processing apparatus according to the present disclosure will be described in detail with reference to the accompanying drawings. In addition, the present disclosure is not limited to each embodiment to be described herein below. In addition, it needs to be noted that the drawings are schematic, and for example, the dimensional relationships and ratios of respective components may be different from the actual dimensional relationships and ratios. In addition, portions included in the respective drawings may be different from each other in dimensional relationship and ratio.

There is known a technique of processing a substrate such as a semiconductor wafer with, for example, a processing liquid. In this substrate processing, an actual processing condition may deviate from a desired reference processing condition due to, for example, the apparatus layout of the substrate processing apparatus. As a result, it may be difficult to process the substrate as desired.

Thus, it is expected that the substrate may be processed as desired even in a case where the actual processing condition deviates from the reference processing condition.

<Outline of Substrate Processing System>

Figure 1:
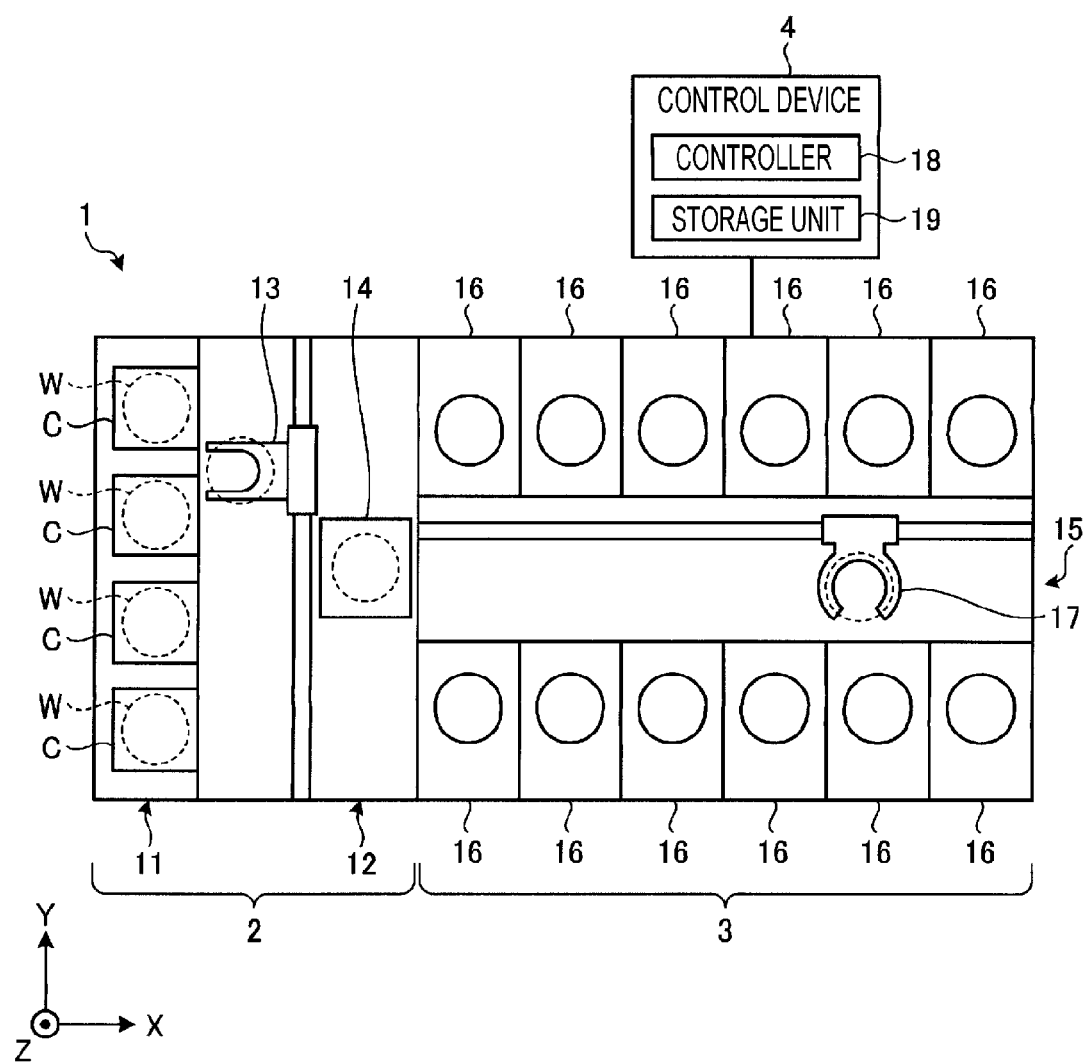
FIG. 1 is a schematic view illustrating an outline of a configuration of a substrate processing system according to an embodiment.

First, an outline of a configuration of a substrate processing system 1 according to an embodiment will be described with reference to FIG. 1. FIG. 1 is a view illustrating the outline of the configuration of the substrate processing system 1 according to the embodiment. In addition, the substrate processing system 1 is an example of a substrate processing apparatus. In the descriptions hereinafter, in order to clarify the positional relationship, an X axis, a Y axis, and a Z axis which are orthogonal to each other will be defined, and the positive direction of the Z axis will be defined as the vertically upward direction.

As illustrated in FIG. 1, the substrate processing system 1 includes a carry-in/out station 2 and a processing station 3.

The carry-in/out station 2 and the processing station 3 are provided adjacent to each other.

The carry-in/out station 2 includes a carrier placing section 11 and a transfer section 12. In the carrier placing section 11, a plurality of carriers C are placed to accommodate a plurality of substrates, i.e., semiconductor wafers W in the embodiment (hereinafter, referred to as "wafers W"), in a horizontal state.

The transfer section 12 is provided adjacent to the carrier placing section 11, and includes a substrate transfer device 13 and a delivery unit 14 therein. The substrate transfer device 13 includes a wafer holding mechanism that holds the wafer W. Further, the substrate transfer device 13 is movable horizontally and vertically, and pivotable around a vertical axis. The substrate transfer device 13 transfers the wafer W between a carrier C and the delivery unit 14 by using the wafer holding mechanism.

The processing station 3 is provided adjacent to the transfer section 12. The processing station 3 includes a transfer section 15 and a plurality of processing units 16. The plurality of processing units 16 are arranged at both sides of the transfer section 15.

The transfer section 15 includes a substrate transfer device 17 therein. The substrate transfer device 17 is provided with a wafer holding mechanism that holds the wafer W. Further, the substrate transfer device 17 is movable horizontally and vertically, and pivotable around a vertical axis. The substrate transfer device 17 transfers the wafer W between the delivery unit 14 and a processing unit 16 by using the wafer holding mechanism.

Each processing unit 16 performs a predetermined substrate processing on the wafer W transferred by the substrate transfer device 17.

Further, the substrate processing system 1 includes a control device 4. The control device 4 is, for example, a computer and includes a controller 18 and a storage unit 19. The storage unit 19 stores programs for controlling various processings to be performed in the substrate processing system 1. The controller 18 controls the operation of the substrate processing system 1 by reading out and executing the programs stored in the storage unit 19. Details of the control device 4 will be described later.

In addition, the programs may be recorded in a computer-readable recording medium, and installed from the recording medium to the storage unit 19 of the control device 4. The computer-readable recording medium may be, for example, a hard disk (HD), a flexible disk (FD), a compact disk (CD), a magnet optical disk (MO), or a memory card.

In the substrate processing system 1 configured as described above, first, the substrate transfer device 13 of the carry-in/out station 2 takes out the wafer W from a carrier C placed in the carrier placing section 11, and places the taken-out wafer W on the delivery unit 14. The wafer W placed on the delivery unit 14 is taken out from the delivery unit 14 by the substrate transfer device 17 of the processing station 3, and carried into the processing unit 16.

The wafer W carried into the processing unit 16 is processed by the processing unit 16, and then, carried out from the processing unit 16 by the substrate transfer device 17 to be placed on the delivery unit 14. Then, the processed wafer W that has been placed on the delivery unit 14 returns to the carrier C of the carrier placing section 11 by the substrate transfer device 13.

<Configuration of Processing Unit>

Figure 2:
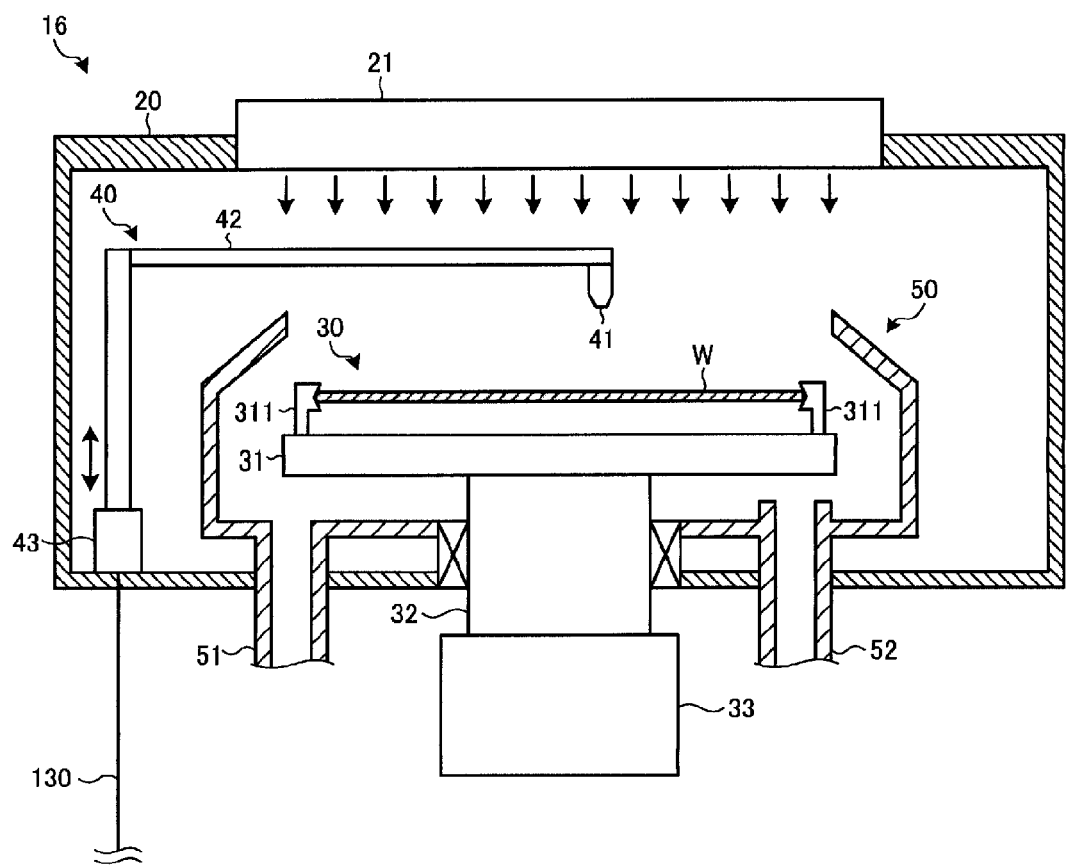
FIG. 2 is a schematic view illustrating a specific example of a configuration of a processing unit.

Next, a configuration of the processing unit 16 will be described with reference to FIG. 2. FIG. 2 is a schematic view illustrating a specific example of the configuration of the processing unit 16. As illustrated in FIG. 2, the processing unit 16 includes a chamber 20, a substrate processing unit 30, a liquid supply 40, and a recovery cup 50.

The chamber 20 accommodates the substrate processing unit 30, the liquid supply 40, and the recovery cup 50. A fan filter unit (FFU) 21 is provided on the ceiling of the chamber 20. The FFU 21 forms a downflow inside the chamber 20.

The substrate processing unit 30 includes a holder 31, a support 32, and a driving unit 33, and performs a liquid processing on the placed wafer W. The holder 31 holds the wafer W horizontally. The support 32 is a vertically extending member, is rotatably supported at the lower base end thereof by the driving unit 33, and supports the holder 31 horizontally at the upper tip end thereof. The driving unit 33 rotates the support 32 around the vertical axis.

The substrate processing unit 30 rotates the support 32 by using the driving unit 33 so as to rotate the holder 31 supported by the support 32, and as a result, rotates the wafer W held on the holder 31.

A holding member 311 is provided on the upper surface of the holder 31 included in the substrate processing unit 30, to hold the wafer W from the side surface thereof. The wafer W is held horizontally by the holding member 311 in a state of being slightly spaced from the upper surface of the holder 31. Further, the wafer W is held by the holder 31 in a state where the surface thereof on which the substrate processing is to be performed faces upward.

The liquid supply 40 supplies a processing fluid to the wafer W. The liquid supply 40 includes a nozzle 41, an arm 42 that supports the nozzle 41 horizontally, and a pivoting and lifting mechanism 43 that pivots and lifts the arm 42.

The nozzle 41 is connected to an ejection line 130. Various processing liquids supplied through the ejection line 130 are ejected from the nozzle 41. The piping configuration of the substrate processing system 1 that includes the ejection line 130 will be described later.

In addition, in the processing unit 16 of the embodiment, an example where one nozzle is provided has been described. However, the number of nozzles provided in the processing unit 16 is not limited to one. In addition, in the processing unit 16 of the embodiment, an example where the nozzle 41 is disposed above the wafer W (close to the front surface of the wafer W) has been described. However, the nozzle 41 may be disposed below of the wafer W (close to the back surface of the wafer W).

The recovery cup 50 is disposed to surround the holder 31, and collects the processing liquid scattered from the wafer W by the rotation of the holder 31. A drain port 51 is formed at the bottom of the recovery cup 50, and the processing liquid collected by the recovery cup 50 is discharged from the drain port 51 to the outside of the processing unit 16. Further, an exhaust port 52 is formed at the bottom of the recovery cup 50 to discharge a gas supplied from the FFU 21 to the outside of the processing unit 16.

<Piping Configuration of Substrate Processing System>

Figure 3:
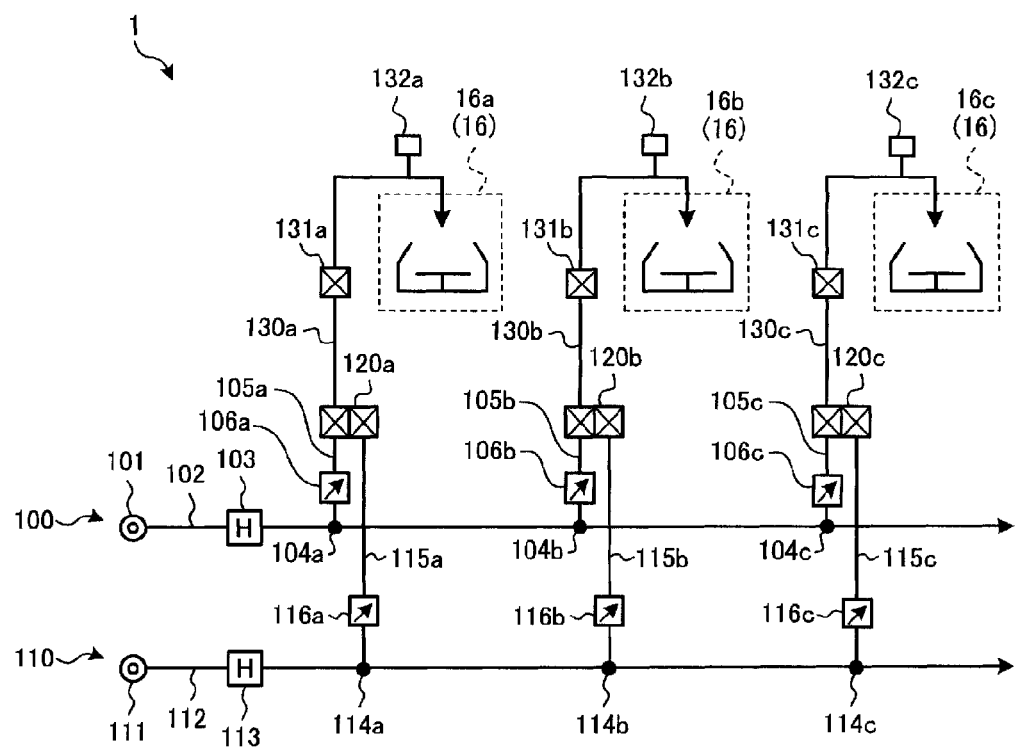
FIG. 3 is a schematic view illustrating a piping configuration of the substrate processing system according to the embodiment.

Next, the piping configuration of the substrate processing system 1 connected to the processing unit 16 will be described with reference to FIG. 3. FIG. 3 is a schematic view illustrating the piping configuration of the substrate processing system 1 according to the embodiment.

The example of FIG. 3 represents a case where three processing units 16 (processing units 16a, 16b, and 16c) are arranged. Then, a processing liquid is supplied from a processing liquid supply 100 to the three processing units 16a to 16c, and deionized water (DIW) is supplied from a DIW supply 110.

The processing liquid supply 100 supplies various processing liquids such as an acidic chemical liquid, an alkaline chemical liquid, and an organic solvent to the processing units 16a to 16c. The processing liquid supply 100 includes a processing liquid supply source 101, a supply line 102, and a heater 103. Then, the processing liquid supplied from the processing liquid supply source 101 to the supply line 102 is heated to a desired temperature by the heater 103, and flows to the downstream side of the supply line 102.

The supply line 102 includes branch portions 104a, 104b, and 104c in this order from the upstream side thereof. Then, a branch line 105a is branched from the branch portion 104a, a branch line 105b is branched from the branch portion 104b, and a branch line 105c is branched from the branch portion 104c.

Further, the branch line 105a is connected to a merging portion 120a, the branch line 105b is connected to a merging portion 120b, and the branch line 105c is connected to a merging portion 120c. Further, the branch line 105a is provided with a flow rate regulator 106a, the branch line 105b is provided with a flow rate regulator 106b, and the branch line 105c is provided with a flow rate regulator 106c.

The DIW supply 110 supplies the DIW to the processing units 16a to 16c. The DIW supply 110 includes a DIW supply source 111, a supply line 112, and a heater 113. Then, the DIW supplied from the DIW supply source 111 to the supply line 112 is heated to a desired temperature by the heater 113, and flows to the downstream side of the supply line 112.

The supply line 112 includes branch portions 114a, 114b, and 114c in this order from the upstream side thereof. Then, a branch line 115a is branched from the branch portion 114a, a branch line 115b is branched from the branch portion 114b, and a branch line 115c is branched from the branch portion 114c.

In addition, the branch line 115a is connected to the merging portion 120a, the branch line 115b is connected to the merging portion 120b, and the branch line 115c is connected to the merging portion 120c. Further, the branch line 115a is provided with a flow rate regulator 116a, the branch line 115b is provided with a flow rate regulator 116b, and the branch line 115c is provided with a flow rate regulator 116c.

The processing liquid merged with the DIW in the merging portion 120a is regulated to a desired concentration by using the flow rate regulators 106a and 116a, and supplied to the ejection line 130a. In addition, only the DIW may be supplied to the ejection line 130a by stopping the flow of the processing liquid in the merging portion 120a, and only the processing liquid may be supplied to the ejection line 130a by stopping the flow of the DIW in the merging portion 120a.

Then, when a valve 131a provided in the ejection line 130a is opened for a predetermined time, the processing liquid is ejected to the wafer W placed in the processing unit 16a (see FIG. 2). In addition, a temperature sensor 132a may be provided in the ejection line 130a to measure the temperature of the processing liquid that flows through the ejection line 130a.

The processing liquid merged with the DIW in the merging portion 120b is regulated to a desired concentration by using the flow rate regulators 106b and 116b, and supplied to the ejection line 130b. In addition, only the DIW may be supplied to the ejection line 130b by stopping the flow of the processing liquid in the merging portion 120b, and only the processing liquid may be supplied to the ejection line 130b by stopping the flow of the DIW at the merging portion 120b.

Then, when a valve 131b provided in the ejection line 130b is opened for a predetermined time, the processing liquid is ejected to the wafer W placed in the processing unit 16b. In addition, a temperature sensor 132b may be provided in the ejection line 130b to measure the temperature of the processing liquid that flows through the ejection line 130b.

The processing liquid merged with the DIW in the merging portion 120c is regulated to a desired concentration by using the flow rate regulators 106c and 116c, and supplied to the ejection line 130c. In addition, only the DIW may be supplied to the ejection line 130c by stopping the flow of the processing liquid in the merging portion 120c, and only the processing liquid may be supplied to the ejection line 130c by stopping the flow of the DIW in the merging portion 120c.

Then, when a valve 131c provided in the ejection line 130c is opened for a predetermined time, the processing liquid is ejected to the wafer W placed in the processing unit 16c. In addition, a temperature sensor 132c may be provided in the ejection line 130c to measure the temperature of the processing liquid that flows through the ejection line 130c.

<Details of Control Device>

Figure 4:
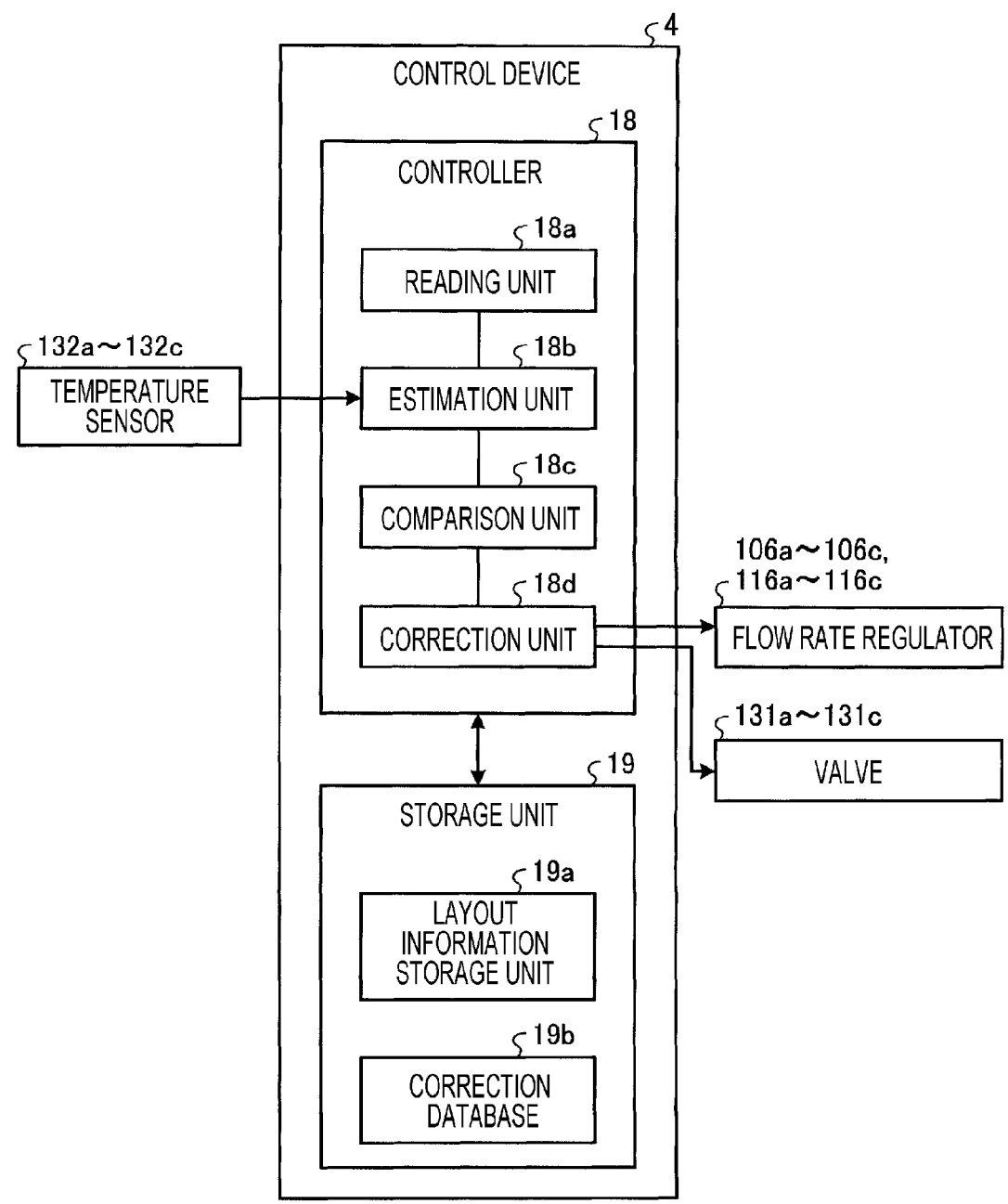
FIG. 4 is a block diagram illustrating an outline of a configuration of a control device according to the embodiment.

Next, details of the control device 4 that controls the substrate processing system 1 will be described with reference to FIG. 4. FIG. 4 is a block diagram illustrating an outline of a configuration of the control device 4 according to the embodiment. As described above, the control device 4 includes the controller 18 and the storage unit 19.

The storage unit 19 is implemented by, for example, a semiconductor memory element such as a RAM (random access memory) or a flash memory, or a storage device such as a hard disk or an optical disk. As illustrated in FIG. 4, the storage unit 19 includes a layout information storage unit 19a and a correction database 19b.

The layout information storage unit 19a stores various types of information on the apparatus layout of the substrate processing system 1. The layout information storage unit 19a stores, for example, information such as the piping configuration of the substrate processing system 1 illustrated in FIG. 3 and the number or the installation positions of the processing units 16.

The correction database 19b stores, when a value of one parameter among various parameters included in the processing condition of the wafer W deviates from a reference value, information on how a parameter different from the deviating parameter is to be corrected in order to continue a desired processing. In addition, the various parameters included in the processing condition of the wafer W are, for example, the temperature, flow rate, concentration, and processing time of the processing liquid.

For example, the correction database 19b stores, when the temperature of the processing liquid deviates from a reference value, information on a value to which, for example, the flow rate, concentration or processing time of the processing liquid which is a parameter different from the temperature is to be corrected in order to continue a desired processing.

Specifically, the correction database 19b stores information indicating the correlation (e.g., correlation equation) among the plurality of parameters included in the processing condition of the wafer W. The information included in the correction database 19b may be obtained in advance through, for example, experiments using the substrate processing system 1.

For example, the controller 18 is implemented by executing various programs stored in the storage unit 19 using the RAM as a working area with, for example, a CPU (central processing unit) or an MPU (micro processing unit). In addition, the controller 18 is implemented by, for example, an integrated circuit such as an ASIC (application specific integrated circuit) or an FPGA (field programmable gate array).

As illustrated in FIG. 4, the controller 18 includes a reading unit 18a, an estimation unit 18b, a comparison unit 18c, and a correction unit 18d, and implements or executes functions or operations of a control process to be described later. In addition, the internal configuration of the controller 18 is not limited to the configuration illustrated in FIG. 4, and may be another configuration as long as the configuration performs the control process to be described later.

The reading unit 18a reads out a reference processing condition for processing the wafer W. For example, in order to process the wafer W as desired, the reading unit 18a reads out a processing condition included in a recipe set by an operator as the reference processing condition. This reference processing condition includes various parameters such as the temperature, flow rate, concentration, and processing time of the processing liquid.

The estimation unit 18b estimates an actual processing condition when the wafer W is processed. For example, the estimation unit 18b estimates the actual processing condition based on the apparatus layout of the substrate processing system 1 that is stored in the layout information storage unit 19a. In addition, the estimation unit 18b may estimate the actual processing condition based on information from sensors provided in the substrate processing system 1 (e.g., temperature sensors 132a to 132c).

The comparison unit 18c compares the reference processing condition for processing the wafer W that has been read out by the reading unit 18a, and the actual processing condition when the wafer W is processed that has been estimated by the estimation unit 18b with each other. As a result, the comparison unit 18c may obtain information on a parameter of which value deviates under the actual processing condition, among the parameters included in the reference processing condition.

The correction unit 18d corrects the processing condition of the wafer W based on the comparison result in the comparison unit 18c. Specifically, the correction unit 18d corrects the processing condition of the wafer W based on the information obtained in the comparison unit 18c on a parameter of which value deviates under the actual processing condition, and the information stored in the correction database 19b.

Then, the correction unit 18d corrects a parameter different from the parameter that deviates from the actual processing condition, among the plurality of parameters included in the reference processing condition.

<Specific Example of Control Process>

Figure 5:
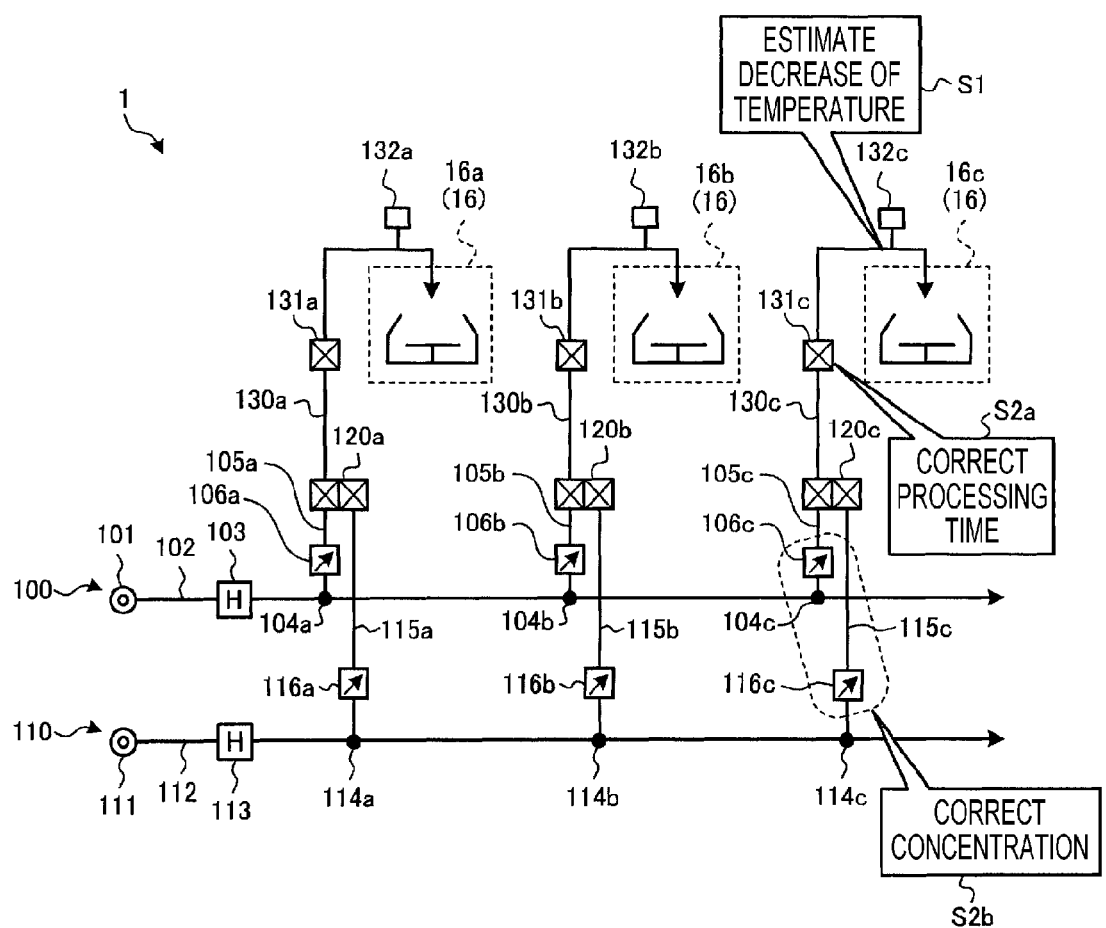
FIG. 5 is a view for explaining a specific example of a control process according to the embodiment.

Next, a specific example of the control process described above will be described with reference to FIGS. 5, 6, 7A to 7C, 8A to 8E, and 9A to 9E. FIG. 5 is a view for explaining a specific example of the control process according to the embodiment. Here, descriptions will be made on a case where the wafer W is processed with the processing liquid in each of the plurality of processing units 16a to 16c.

First, in order to process the wafer W as desired, the reading unit 18a reads out the processing condition included in the recipe set by the operator as the reference processing condition. Next, as illustrated in FIG. 5, the estimation unit 18b estimates a decrease in the temperature of the processing liquid ejected to the wafer W in the processing unit 16c (step S1).

This is because the processing unit 16c is connected to the downstream sides of the processing liquid supply 100 and the DIW supply 110 as compared with the processing units 16a and 16b, and thus, the temperature of the processing liquid in the processing unit 16c may decrease as compared with that in the processing units 16a and 16b.

The decrease of the temperature of the processing liquid in the processing unit 16c may be estimated based on, for example, the apparatus layout information of the substrate processing system 1 that is included in the layout information storage unit 19a. The apparatus layout information of the substrate processing system 1 is, for example, installation position information of the processing unit 16c that indicates an installation position of the processing unit 16c with respect to the processing liquid supply 100 or the DIW supply 110 and the other processing units 16a and 16b. In addition, the decrease of the temperature of the processing liquid in the processing unit 16c may be estimated based on information from the temperature sensor 132c provided in the ejection line 130c.

Next, the comparison unit 18c compares the reference processing condition read out by the reading unit 18a and the actual processing condition estimated by the estimation unit 18b with each other. As a result, the comparison unit 18c may obtain information indicating that the actual temperature of the processing liquid in the processing unit 16c becomes lower than the temperature of the reference processing liquid.

Next, the correction unit 18d corrects the processing time of the processing liquid by controlling the valve 131c based on the information on the decrease of the temperature of the processing liquid in the processing unit 16c (step S2a). For example, when the processing liquid is an etching liquid, the decrease of the temperature of the processing liquid causes the decrease of an etching rate, and thus, the processing time may be corrected to be longer than a reference value so as to obtain a desired etching amount.

In addition, the correction unit 18d may correct the concentration of the processing liquid by controlling the flow rate regulators 106c and 116c based on the information on the decrease of the temperature of the processing liquid in the processing unit 16c (step S2b). For example, when the processing liquid is an etching liquid, the concentration of the processing liquid may be corrected to be higher than a reference value so as to obtain a desired etching amount.

In addition, only one of the processing time correcting process (step S2a) and the concentration correcting process (step S2b) described above may be selected or both the processes may be performed together.

As described above, in the embodiment, it is estimated that a parameter included in the processing condition deviates from a reference value, and the actual processing condition is corrected based on the estimation. As a result, even when the actual processing condition deviates from the reference processing condition, the wafer W may be processed as desired.

Further, in the embodiment, the actual processing condition is estimated based on the apparatus layout of the substrate processing system 1, so that even when operators may not recognize that a parameter deviates from a reference value, the deviation from the reference value may be estimated.

Further, in the embodiment, the actual processing condition is estimated based on information from a sensor provided in the substrate processing system 1 (here, the temperature sensor 132c), so that the deviation from a reference value may be more accurately estimated.

Further, in the embodiment, a parameter different from the parameter that deviates from the actual processing condition is corrected, so that even when a parameter which may not be corrected depending on the apparatus configuration deviates from a reference value, the wafer W may be processed as desired.

In addition, in the embodiment described above, a case where the processing liquid is an etching liquid has been described. However, the processing liquid is not limited to the etching liquid, and may be any kind of processing liquid. Further, while a case where the temperature of the processing liquid becomes lower than a reference value has been described, the embodiment described above may be applied to a case where the temperature of the processing liquid becomes higher than a reference value.

For example, in a case where wafers W are continuously processed with a high-temperature processing liquid, the temperature of the processing unit 16c increases due to the heat accumulation, and the increase of the temperature of the processing unit 16c may cause the increase of the processing liquid.

In this case as well, the wafer W may be processed as desired by performing at least one of the processing time correcting process (step S2a) and the concentration correcting process (step S2b) as described above.

For example, since the increase of the temperature of the etching liquid which is the processing liquid causes the increase of the etching rate, the processing time may be corrected to be shorter than a reference value or the concentration of the processing liquid may be corrected to be lower than a reference value, so as to obtain a desired etching amount.

Figure 6:
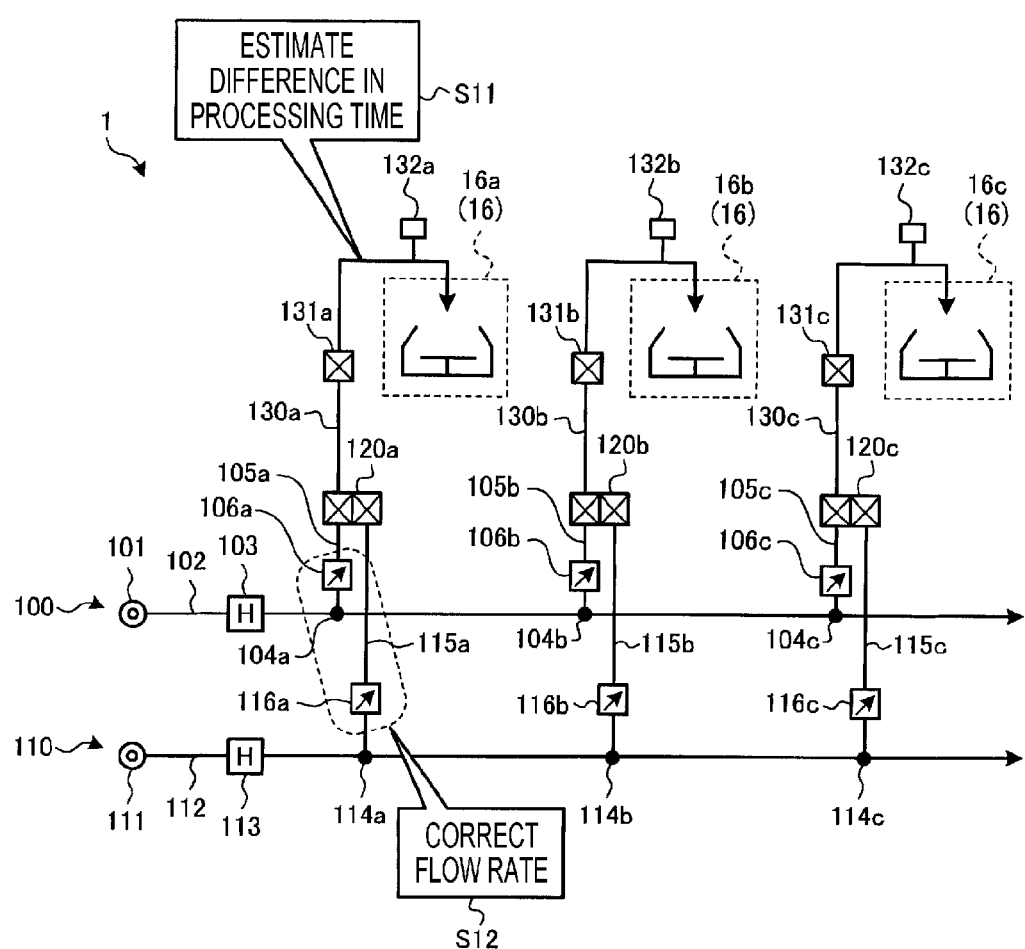
FIG. 6 is a view for explaining another specific example of the control process according to the embodiment.

FIG. 6 is a view for explaining another specific example of the control process according to the embodiment. For example, when the back surface of the wafer W is subjected to a cleaning processing, the processing may be performed by discharging a processing liquid as a cleaning liquid and DIW from the same back surface nozzle, so as to suppress the risk of contamination of the back surface nozzle by the processing liquid.

In the cleaning processing of the back surface of the wafer W, first, the merging portion 120a close to the branch line 105a is opened to supply the processing liquid to the processing unit 16a, and then, the merging portion 120a close to the branch line 115a is opened to supply the DIW to the processing unit 16a.

However, even though the merging portion 120a close to the branch line 105a is opened to supply the processing liquid, the DIW used in the previous rinsing processing remains in the downstream side of the ejection line 130a from the merging portion 120a. Hence, when the merging portion 120a close to the branch line 105a is opened to supply the processing liquid, the DIW that remains in the downstream from the merging portion 120a is first ejected from the back surface nozzle. Accordingly, the actual processing time of the processing liquid becomes shorter than a set processing time of the processing liquid.

In addition, when the merging portion 120a close to the branch line 105a is closed after the processing liquid is supplied, the processing liquid remains in the downstream side from the merging portion 120a, and thus, the remaining processing liquid is first ejected from the back surface nozzle when the DIW is ejected next time. Accordingly, when the ejection flow rates of the DIW and the processing liquid are the same, the processing time does not substantially change.

Meanwhile, when the ejection flow rate of the DIW is larger than the ejection flow rate of the processing liquid, the liquid processing with the processing liquid is ended earlier than the rinsing processing with the DIW, and thus, the actual processing time of the liquid processing with the processing liquid becomes shorter than a reference processing time.

Thus, in the example of FIG. 6, the estimation unit 18b estimates the difference in the processing time based on the apparatus layout information of the substrate processing system 1 (step S11). The apparatus layout information of the substrate processing system 1 is, for example, the piping information of the processing unit 16, and specifically, nozzle assignment information indicating whether the processing liquid and the DIW to be supplied to the wafer W in the processing unit 16 are ejected from the same nozzle. Then, based on the difference in the processing time, the correction unit 18d corrects the flow rate of the processing liquid or DIW by controlling the flow rate regulator 106a or 116a (step S12).

Here, a specific example of the processing in the example of FIG. 6 will be described with reference to FIGS. 7A to 7C, 8A to 8E, and 9A to 9E. FIGS. 7A to 7C, 8A to 8E, and 9A to 9E are views (parts 1 to 3) for explaining details of another specific example of the control process according to the embodiment.

Figure 7A:
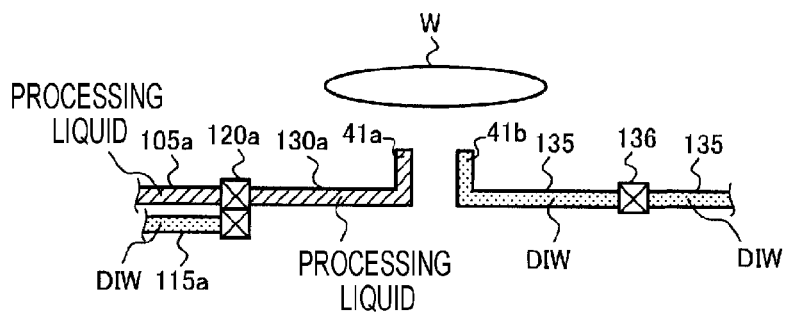
FIGS. 7A to 7C are views (part 1) for explaining details of another specific example of the control process according to the embodiment.
Figure 7B:
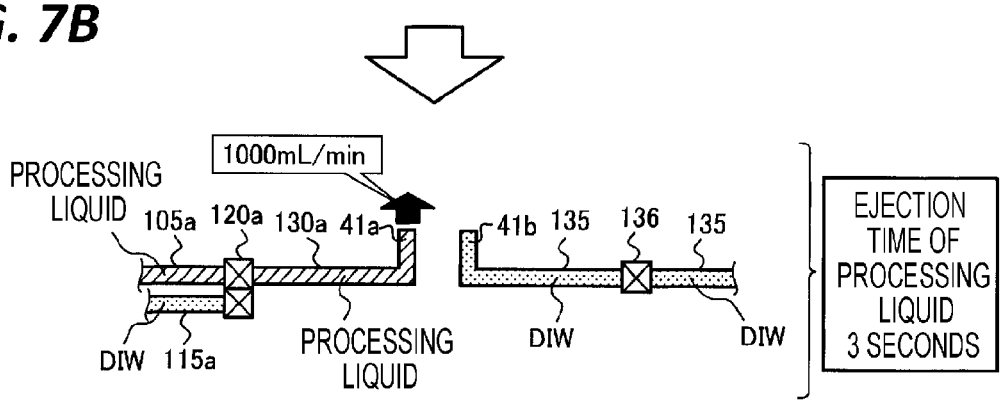
Figure 7C:
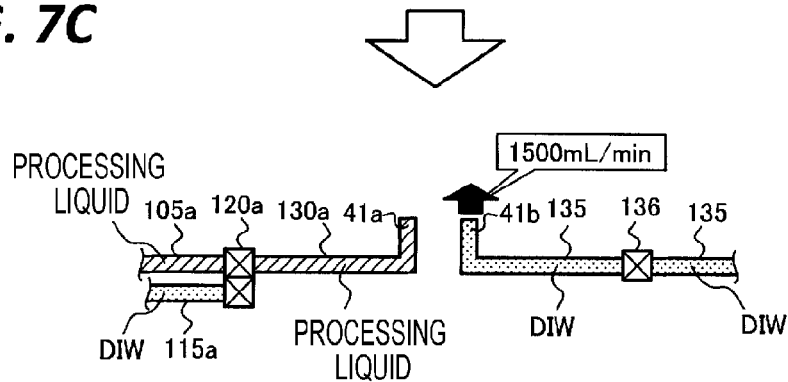

FIG. 7A to 7C represent an example where the processing liquid and the DIW to be supplied to the wafer W are ejected from separate nozzles. That is, as illustrated in FIG. 7A, the processing liquid is ejected from a back surface nozzle 41a provided at the tip end of the ejection line 130a to the back surface of the wafer W, and the DIW is ejected from a back surface nozzle 41b separately provided at the tip end of an ejection line 135 to the back surface of the wafer W.

In addition, although not illustrated, the ejection line 135 is connected to the DIW supply 110. Then, by controlling a valve 136 provided in the ejection line 135, the DIW may be ejected from the back surface nozzle 41b.

In addition, in FIGS. 7A to 7C, 8A to 8E, and 9A to 9E, in order to facilitate the understanding, the portion filled with the processing liquid inside the pipe is obliquely hatched, and the portion filled with the DIW inside the pipe is dotted.

First, as illustrated in FIG. 7B, the liquid processing for supplying the processing liquid to the back surface nozzle 41a is performed by controlling, for example, the merging portion 120a. In the liquid processing, it is assumed that the processing liquid is set in advance by users to be ejected from the back surface nozzle 41a at a flow rate of 1,000 mL/min for 3 seconds.

Next, as illustrated in FIG. 7C, the rinsing processing for supplying the DIW to the back surface nozzle 41b is performed by controlling, for example, the valve 136. In the rinsing processing, it is assumed that the DIW is set in advance by users to be ejected at a flow rate of 1,500 mL/min for a predetermined time.

As illustrated in FIGS. 7A to 7C, when the liquid processing and the rinsing processing are performed using the separate nozzles, the set processing time of the liquid processing and the rinsing processing matches the actual processing time. In addition, as illustrated in FIGS. 7A to 7C, the processing time achieved by the hardware configuration with which the set processing time of the liquid processing and the rinsing processing matches the actual processing time is taken as the reference processing time.

Figure 8A:
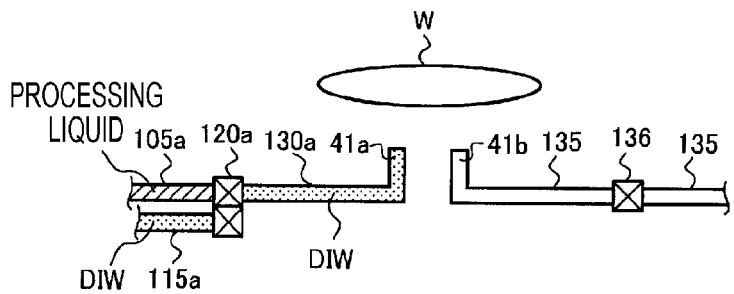
FIGS. 8A to 8E are views (part 2) for explaining details of another specific example of the control process according to the embodiment.

FIGS. 8A to 8E represent a case where the processings performed using the separate nozzles in FIGS. 7A to 7C are performed by the same back surface nozzle 41a under the same setting condition as that in FIGS. 7A to 7C. In addition, as illustrated in FIG. 8A, since the rinsing processing with the DIW in the previous processing is being performed, the ejection line 130a is filled with the DIW before the liquid processing is started.

Figure 8B:
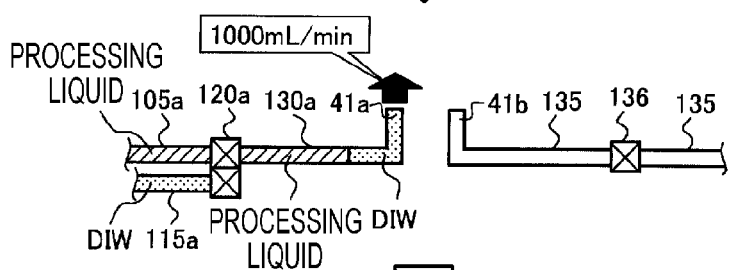

First, as illustrated in FIG. 8B, the liquid processing for supplying the processing liquid to the back surface nozzle 41a is performed by controlling, for example, the merging portion 120a. In the liquid processing, it is assumed that the processing liquid is set in advance by users to be ejected at the flow rate of 1,000 mL/min for 3 seconds as in the example of FIGS. 7A to 7C.

Figure 8C:
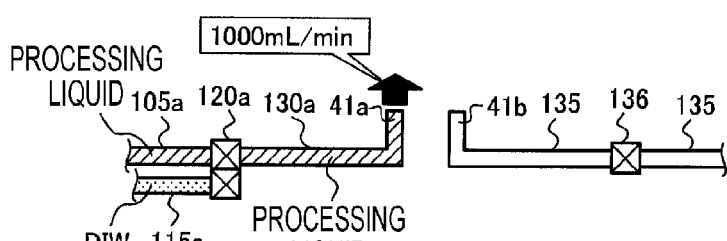

However, since the ejection line 130a is filled with the DIW before the liquid processing is started, the DIW is initially ejected from the back surface nozzle 41a in the liquid processing as illustrated in FIG. 8B. Then, as illustrated in FIG. 8C, after the ejection line 130a is filled with the processing liquid, the processing liquid is ejected from the back surface nozzle 41a.

Figure 8D:
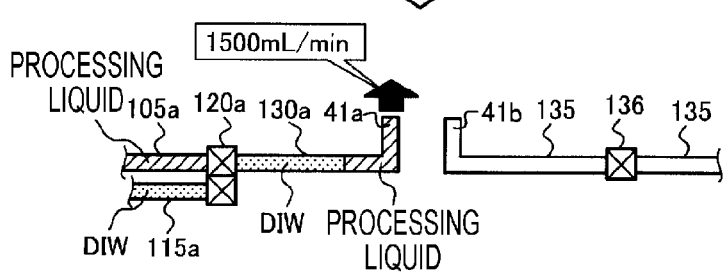

Next, as illustrated in FIG. 8D, the rinsing processing for supplying the DIW to the back surface nozzle 41a is performed by controlling, for example, the merging portion 120a. In the rinsing processing, it is assumed that the DIW is set in advance by users to be ejected at the flow rate of 1,500 mL/min for a predetermined time as in the example of FIGS. 7A to 7C.

Figure 8E:
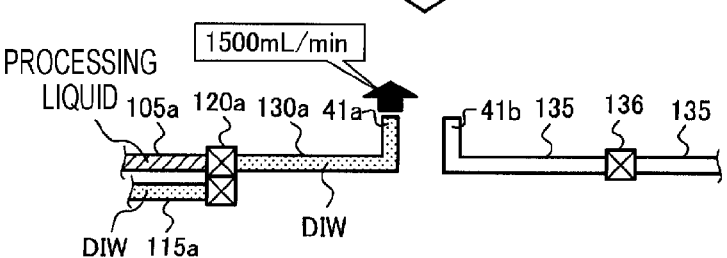

However, since the ejection line 130a is filled with the processing liquid before the rinsing processing is started, the processing liquid is initially ejected from the back surface nozzle 41a in the rinsing processing as illustrated in FIG. 8D. Then, as illustrated in FIG. 8E, after the ejection line 130a is filled with the DIW, the DIW is ejected from the back surface nozzle 41a.

In addition, in the rinsing processing, while the processing liquid is initially ejected from the back surface nozzle 41a, the rinsing processing is being performed at the flow rate of 1,500 mL/min. Hence, the time during which the processing liquid remaining in the ejection line 130a is ejected becomes shorter than the time during which the processing liquid is ejected at the flow rate of 1,000 mL/min.

Accordingly, the ejection time of the processing liquid ejected in the second half of the liquid processing and the first half of the rinsing processing becomes 2 seconds in total which is shorter than 3 seconds that is the reference processing time represented in the example of FIGS. 7A to 7C. That is, despite that it has been desired to perform the liquid processing by discharging the processing liquid for 3 seconds, the liquid processing is ejected for only 2 seconds which is shorter than the set processing time, and as a result, the desired liquid processing may not be performed.

Thus, in the embodiment, the difference of the processing time is estimated based on the nozzle assignment information indicating whether the processing liquid and the DIW to be supplied to the wafer W in the processing unit 16 are ejected from the same nozzle, and the flow rate is corrected so as to perform the desired liquid processing. FIGS. 9A to 9E represent a specific example of the correcting process.

Figure 9A:
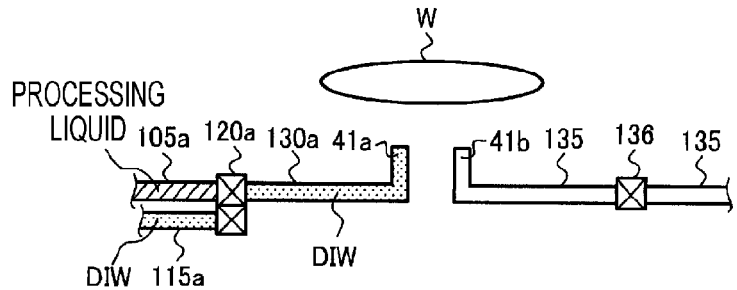
FIGS. 9A to 9E are views (part 3) for explaining details of another specific example of the control process according to the embodiment.

As illustrated in FIG. 9A, since the rinsing processing with the DIW in the previous processing is being performed, the ejection line 130a is filled with the DIW before the liquid processing is started.

Figure 9B:
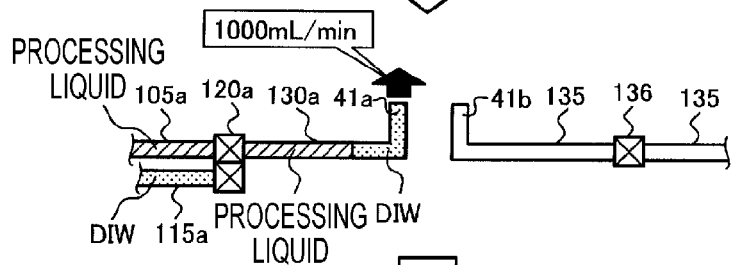

First, as illustrated in FIG. 9B, the liquid processing for supplying the processing liquid to the back surface nozzle 41a is performed by controlling, for example, the merging portion 120a. In the liquid processing, it is assumed that the processing liquid is set in advance by users to be ejected at the flow rate of 1,000 mL/min for 3 seconds as in the example of FIGS. 7A to 7C.

Figure 9C:
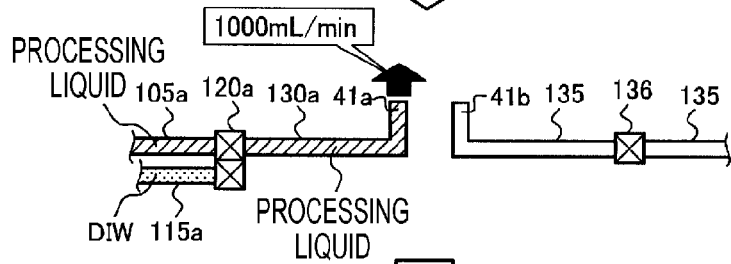

However, since the ejection line 130a is filled with the DIW before the liquid processing is started, the DIW is initially ejected from the back surface nozzle 41a in the liquid processing as illustrated in FIG. 9B. Then, as illustrated in FIG. 9C, after the ejection line 130a is filled with the processing liquid, the processing liquid is ejected from the back surface nozzle 41a.

Figure 9D:
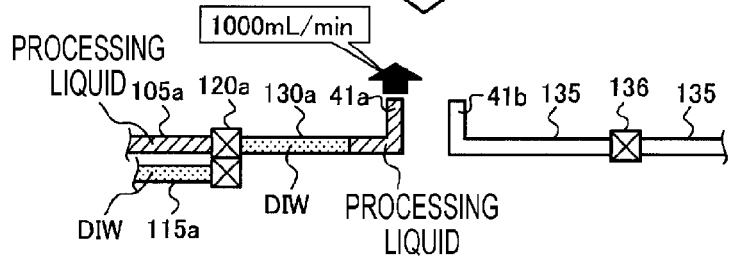
Figure 9E:
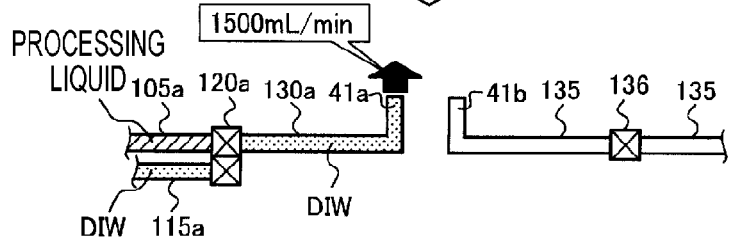

Next, as illustrated in FIGS. 9D and 9E, the rinsing processing for supplying the DIW to the back surface nozzle 41a is performed by controlling, for example, the merging portion 120a.

Here, in the embodiment, as illustrated in FIG. 9D, the correction unit 18d corrects the flow rate in the rinsing processing to 1,000 mL/min which is the same condition as that in the liquid processing, until the processing liquid disappears from the ejection line 130a. Then, as illustrated in FIG. 9E, the correction unit 18d returns the flow rate to the desired flow rate of 1,500 mL/min after the processing liquid disappears from the ejection line 130a.

As a result, the ejection time of the processing liquid ejected in the second half of the liquid processing and the first half of the rinsing processing may be adjusted to 3 seconds in total which matches the reference processing time of 3 seconds represented in the example of FIGS. 7A to 7C.

As described above, when the processing liquid and the DIW are ejected from the same back surface nozzle 41a, even though the processing time of the processing liquid or the DIW is different from a reference value, the wafer W may be processed as desired.

<Modifications>

Figure 10:
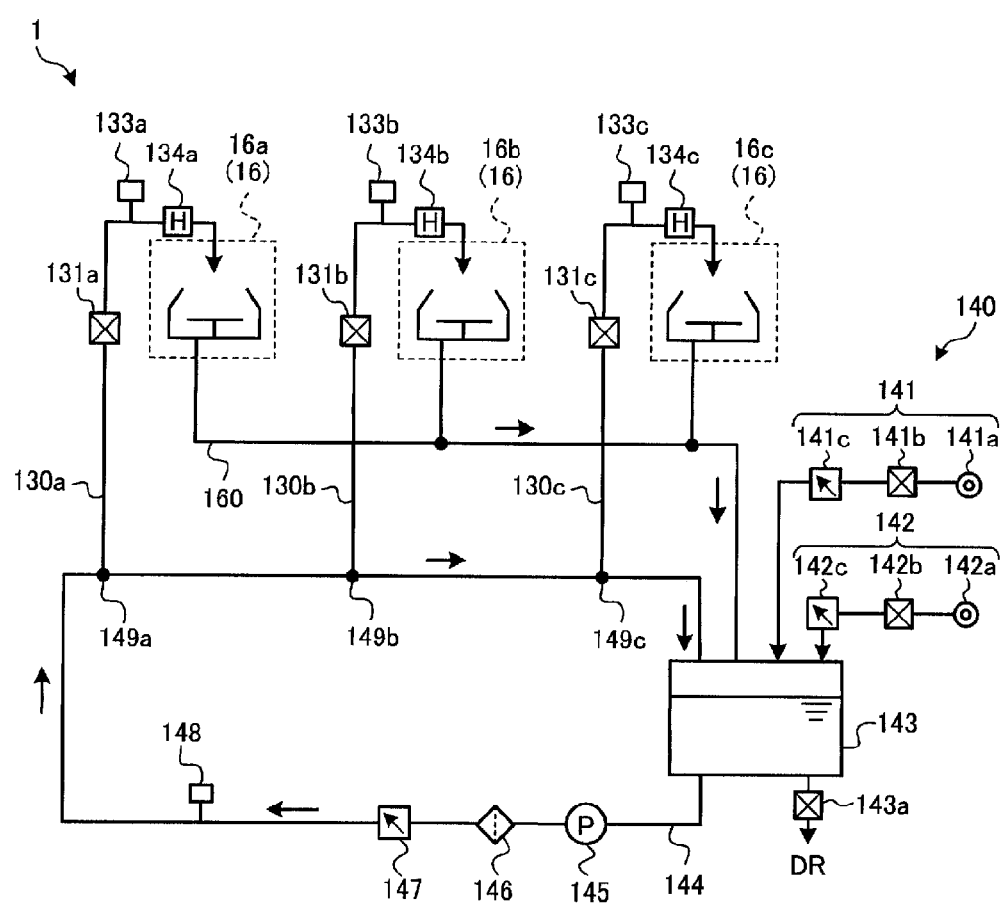
FIG. 10 is a schematic view illustrating a piping configuration of a substrate processing system according to a modification of the embodiment.

Subsequently, a piping configuration of the substrate processing system 1 according to modifications of the embodiment will be described with reference to FIG. 10. FIG. 10 is a schematic view illustrating the piping configuration of the substrate processing system 1 according to a modification of the embodiment.

As illustrated in FIG. 10, the substrate processing system 1 according to the modification is different from the embodiment in that in the modification, the processing liquid used in the processing units 16a to 16c is recovered in a tank 143 through a recovery line 160 so as to be reused. Thus, the same portions as those in the embodiment will be denoted by the same reference numerals as used in the embodiment, and detailed descriptions thereof will be omitted.

The substrate processing system 1 according to the modification includes a supply 140 that supplies processing liquids obtained by combining various processing liquids with the DIW to have a predetermined concentration, to the processing units 16a to 16c. The supply 140 includes a processing liquid supply 141, a DIW supply 142, a tank 143, and a circulation line 144.

The processing liquid supply 141 supplies various processing liquids to the tank 143. The processing liquid supply 141 includes a processing liquid supply source 141a, a valve 141b, and a flow rate regulator 141c. The DIW supply 142 supplies the DIW to the tank 143. The DIW supply 142 includes a DIW supply source 142a, a valve 142b, and a flow rate regulator 142c.

The tank 143 uses the processing liquid supply 141 and the DIW supply 142 so as to store the processing liquids obtained by combining various processing liquids with the DIW to have a predetermined concentration. Further, the tank 143 is connected to a drain via a valve 143a. Thus, when the processing liquids in the tank 143 are replaced, the controller 18 may control the valve 143a to discharge the processing liquids in the tank 143 to the drain.

The circulation line 144 exits from the tank 143 and returns to the tank 143. The circulation line 144 is provided with a pump 145, a filter 146, a flow rate regulator 147, a concentration sensor 148, and branch portions 149a to 149c in this order from the upstream side of the circulation line 144 with respect to the tank 143.

The pump 145 forms a circulation flow of the processing liquid that exits from the tank 143, passes through the circulation line 144, and returns to the tank 143. The filter 146 removes contaminants such as particles contained in the processing liquid that circulates in the circulation line 144. The flow rate regulator 147 regulates the flow rate of the circulation flow of the processing liquid that passes through the circulation line 144. The concentration sensor 148 measures the concentration of the processing liquid that passes through the circulation line 144.

The ejection line 130a is branched from the branch portion 149a, the ejection line 130b is branched from the branch portion 149b, and the ejection line 130c is branched from the branch portion 149c. The ejection line 130a is provided with a valve 131a, a flow rate sensor 133a, and a heater 134a. The ejection line 130b is provided with a valve 131b, a flow rate sensor 133b, and a heater 134b. The ejection line 130c is provided with a valve 131c, a flow rate sensor 133c, and a heater 134c.

Further, the drain ports 51 of the processing units 16a to 16c (see FIG. 2) are connected to the tank 143 through the common recovery line 160.

Figure 11:
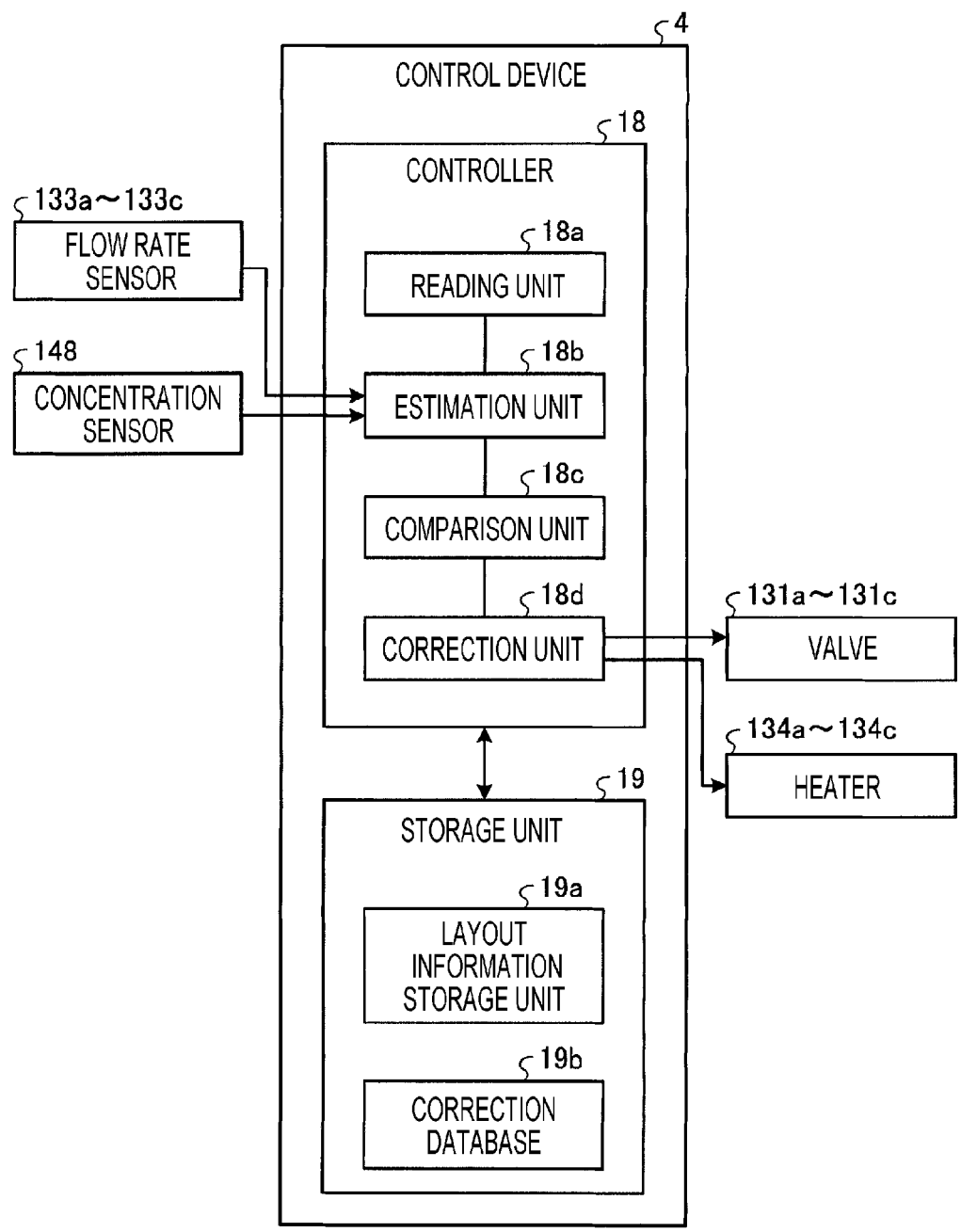
FIG. 11 is a block diagram illustrating an outline of a configuration of a control device according to the modification of the embodiment.

FIG. 11 is a block diagram illustrating an outline of a configuration of the control device 4 according to the modification of the embodiment. Since the internal configuration of the control device 4 according to the modification is the same as that in the embodiment illustrated in FIG. 4, detailed descriptions thereof will be omitted.

Meanwhile, in the modification illustrated in FIG. 11, the estimation unit 18b receives information from the flow rate sensors 133a to 133c and information from the concentration sensor 148. Further, in the modification, the correction unit 18d controls the valves 131a to 131c and the heaters 134a to 134c.

Figure 12:
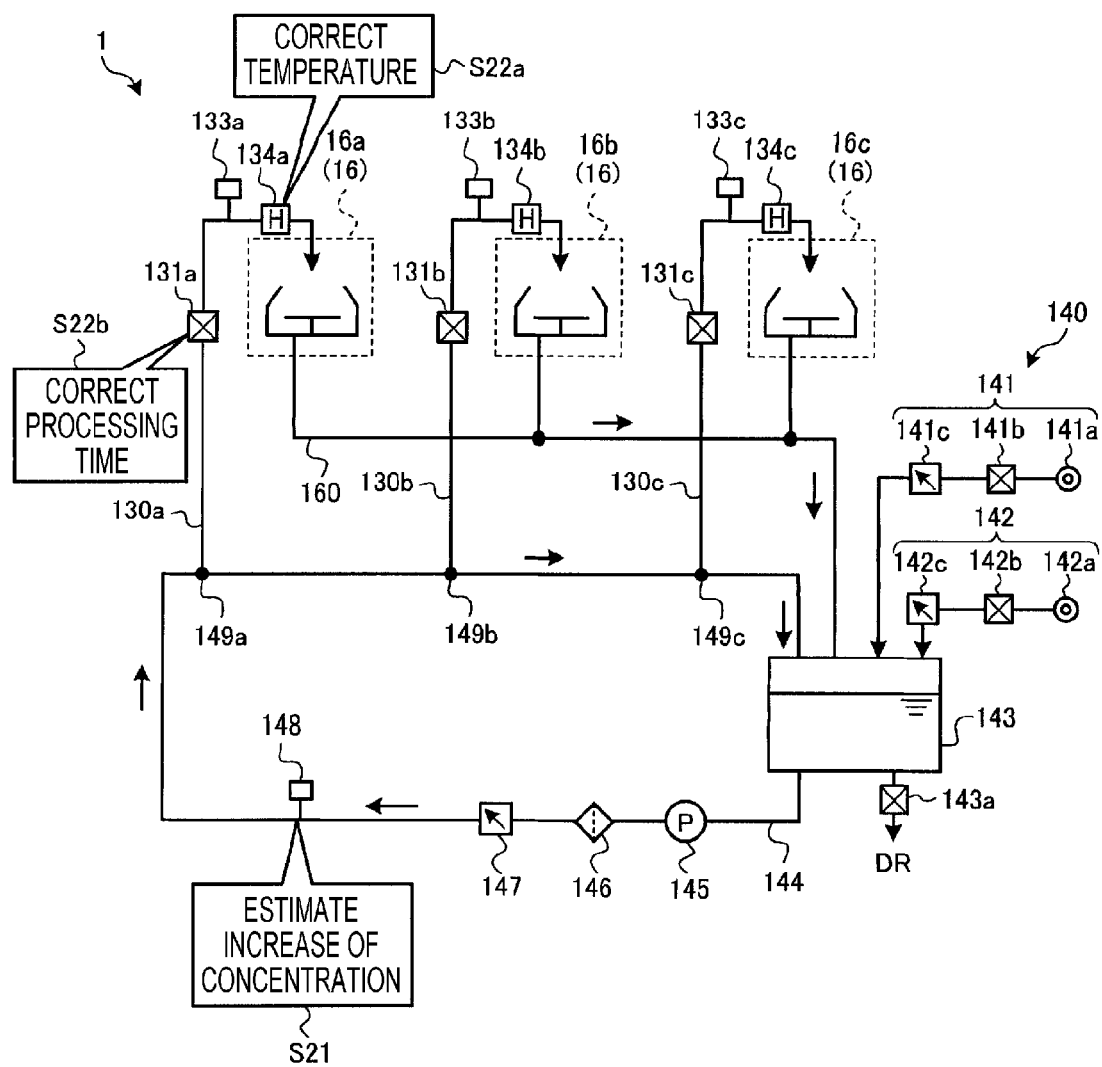
FIG. 12 is a view for explaining a specific example of a control process according to the modification of the embodiment.

Next, a specific example of the control process according to the modification will be described with reference to FIGS. 12 and 13. FIG. 12 is a view for explaining the specific example of the control process according to the modification of the embodiment.

In the apparatus layout in which the processing liquid supplied to the processing units 16a to 16c is recovered by the recovery line 160 so as to be reused as in the substrate processing system 1 according to the modification, the concentration of the processing liquid supplied from the circulation line 144 may gradually increase as wafers W are processed.

Thus, in the example of FIG. 12, the estimation unit 18b estimates the increase in the concentration of the processing liquid that flows through the circulation line 144 (step S21). The increase of the concentration of the processing liquid that flows through the circulation line 144 may be estimated based on, for example, information from the concentration sensor 148 provided in the circulation line 144.

In addition, the increase of the concentration of the processing liquid that flows through the circulation line 144 may be estimated based on the apparatus layout information of the substrate processing system 1 that is included in the layout information storage unit 19a.

Then, based on the information on the increase of the concentration of the processing liquid that flows through the circulation line 144, the correction unit 18d corrects the temperature of the processing liquid by controlling the heater 134a (step S22a). For example, when the processing liquid is an etching liquid, the increase of the concentration of the processing liquid causes the increase of an etching rate, and thus, the temperature of the processing liquid may be corrected to become lower than a reference value, so as to obtain a desired etching amount.

In addition, based on the information on the increase of the concentration of the processing liquid that flows through the circulation line 144, the correction unit 18d may correct the processing time of the processing liquid by controlling the valve 131a (step S22b). For example, when the processing liquid is an etching liquid, the processing time of the processing liquid may be corrected to become shorter than a reference value, so as to obtain a desired etching amount.

Figure 13:
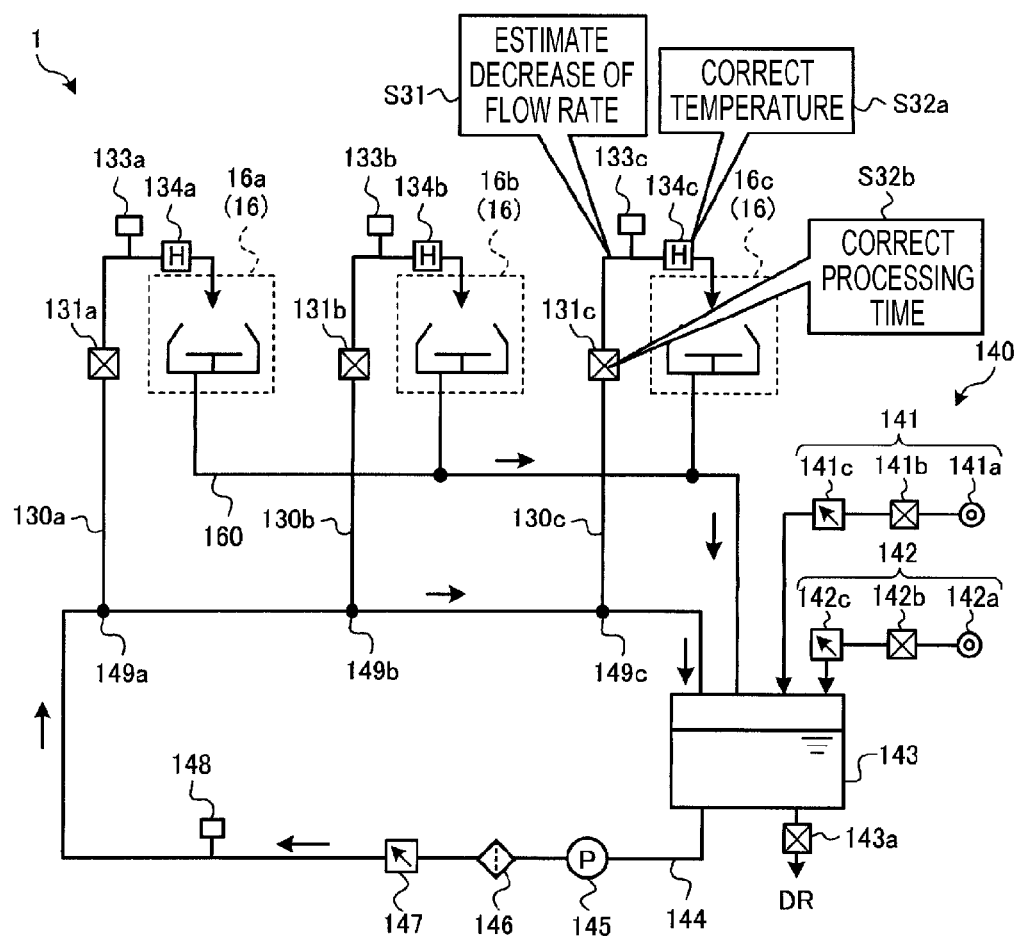
FIG. 13 is a view for explaining another specific example of the control process according to the modification of the embodiment.

FIG. 13 is a view for explaining another specific example of the control process according to the modification of the embodiment. As illustrated in FIG. 13, the estimation unit 18b estimates the decrease in the flow rate of the processing liquid ejected to the wafer W in the processing unit 16c (step S31).

This is because the processing unit 16c is connected to the downstream side of the circulation line 144 as compared with the processing units 16a and 16b, and thus, the supply pressure of the processing liquid in the processing unit 16c may decrease when the processing liquid is simultaneously used for the processing units 16a, 16b, and 16c.

The decrease of the flow rate of the processing liquid in the processing unit 16c may be estimated based on, for example, the apparatus layout information of the substrate processing system 1 that is included in the layout information storage unit 19a. In addition, the decrease of the flow rate of the processing liquid in the processing unit 16c may be estimated based on information from the temperature sensor 133c provided in the ejection line 130c.

Then, based on the information on the decrease of the flow rate of the processing liquid in the processing unit 16c, the correction unit 18d corrects the temperature of the processing liquid by controlling the heater 134c. For example, when the processing liquid is an etching liquid, the decrease of the flow rate of the processing liquid causes the decrease of an etching rate, and thus, the temperature of the processing liquid may be corrected to become higher than a reference value, so as to obtain a desired etching amount.

In addition, based on the information on the decrease of the flow rate of the processing liquid in the processing unit 16c, the correction unit 18d may correct the processing time of the processing liquid by controlling the valve 131c (step S32b). For example, when the processing liquid is an etching liquid, the processing time of the processing liquid may be corrected to become longer than a reference value, so as to obtain a desired etching amount.

As described above, in the modification, it is estimated that a parameter included in the processing condition deviates from a reference value, and the actual processing condition is corrected based on the estimation, as in the embodiment. As a result, even when the actual processing condition deviates from the reference processing condition, the wafer W may be processed as desired.

In addition, only one of the temperature correcting process (steps S22a and S32a) and the processing time correcting process (steps S22b and S32b) described above may be selected or both the processes may be performed together. In addition, in the example of FIG. 12, since it may be estimated that the concentration of the processing liquid supplied to the processing units 16b and 16c also increases, the same processing as performed in the processing unit 16a described above may be performed.

The control device 4 of the substrate processing apparatus (substrate processing system 1) according to the embodiment includes the reading unit 18a, the estimation unit 18b, the comparison unit 18c, and the correction unit 18d. The reading unit 18a reads out the reference processing condition for processing the substrate (wafer W). The estimation unit 18b estimates the actual processing condition when the substrate (wafer W) is processed. The comparison unit 18c compares the reference processing condition and the actual processing condition with each other. The correction unit 18d corrects the processing condition for the substrate (wafer W) based on the comparison result in the comparison unit 18c. As a result, even when the actual processing condition deviates from the reference processing condition, the substrate may be processed as desired.

In addition, in the control device 4 of the substrate processing apparatus (substrate processing system 1) according to the embodiment, the estimation unit 18b estimates the actual processing condition based on the apparatus layout of the substrate processing apparatus (substrate processing system 1). As a result, even when operators may not recognize that a parameter deviates from a reference value, the deviation from the reference value may be estimated.

Further, in the control device 4 of the substrate processing apparatus (substrate processing system 1) according to the embodiment, the estimation unit 18b estimates the actual processing condition based on information from sensors provided in the substrate processing apparatus (substrate processing system 1). As a result, the deviation from a reference value may be more accurately estimated.

Further, in the control device 4 of the substrate processing apparatus (substrate processing system 1) according to the embodiment, the correction unit 18d corrects a parameter different from the parameter that deviates from the actual processing condition, among the plurality of parameters included in the reference processing condition. As a result, even when a parameter which may not be corrected depending on the apparatus configuration deviates from a reference value, the wafer W may be processed as desired.

Further, in the control device 4 of the substrate processing apparatus (substrate processing system 1) according to the embodiment, when the processing time of the processing liquid deviates from the actual processing condition among the plurality of parameters included in the reference processing condition, the correction unit 18d corrects the temperature or concentration of the processing liquid. As a result, even when the processing time of the processing liquid deviates from a reference value, the substrate may be processed as desired.

Further, in the control device 4 of the substrate processing apparatus (substrate processing system 1) according to the embodiment, when the temperature of the processing liquid deviates from the actual processing condition among the plurality of parameters included in the reference processing condition, the correction unit 18d corrects the concentration or processing time of the processing liquid. As a result, even when the temperature of the processing liquid deviates from a reference value, the substrate may be processed as desired.

<Procedure of Control Process>

Figure 14:
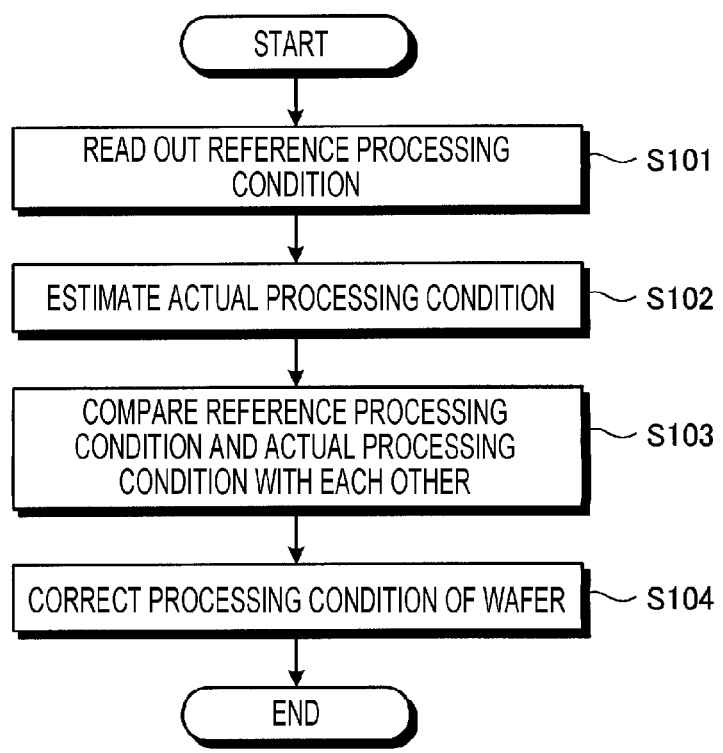
FIG. 14 is a flowchart illustrating a procedure of the control process performed by the control device of the substrate processing system according to the embodiment.

Subsequently, a procedure of the control process according to the embodiment will be described with reference to FIG. 14. FIG. 14 is a flowchart illustrating the procedure of the control process performed by the control device 4 of the substrate processing system 1 according to the embodiment.

First, the reading unit 18a reads out the reference processing condition for processing the wafer W (step S101). For example, in order to process the wafer W as desired, the reading unit 18a reads out the processing condition included in the recipe set by the operator as the reference processing condition.

Next, the estimation unit 18b estimates the actual processing condition when the wafer W is processed (step S102). For example, the estimation unit 18b estimates the actual processing condition based on the apparatus layout of the substrate processing system 1 that is stored in the layout information storage unit 19a. In addition, the estimation unit 18b may estimate the actual processing condition based on information from sensors provided in the substrate processing system 1 (e.g., the temperature sensors 132a to 132c).

Next, the comparison unit 18c compares the reference processing condition for processing the wafer W that has been read out by the reading unit 18a and the actual processing condition that has been estimated by the estimation unit 18b with each other (step S103). As a result, the comparison unit 18c may obtain information on a parameter of which value deviates under the actual processing condition, among the parameters included in the reference processing condition.

Next, the correction unit 18d corrects the processing condition of the wafer W based on the comparison result in the comparison unit 18c (step S104). Specifically, the correction unit 18d corrects the processing condition of the wafer W based on the information obtained in the comparison unit 18c on a parameter of which value deviates under the actual processing condition and the information stored in the correction database 19b. When step S104 is ended, the series of processes are completed.

The control method of the substrate processing apparatus according to the embodiment includes a reading process (step S101), an estimating process (step S102), a comparing process (step S103), and a correcting process (step S104). The reading process (step S101) reads out the reference processing condition for processing the substrate (wafer W). The estimating process (step S102) estimates the actual processing condition when the wafer W is processed. The comparing process (step S103) compares the reference processing condition and the actual processing condition with each other. The correcting process (step S104) corrects the processing condition of the substrate (wafer W) based on the comparison result in the comparing process (step S103). As a result, even when the actual processing condition deviates from the reference processing condition, the substrate may be processed as desired.

While embodiments of the present disclosure have been described, the present disclosure is not limited to the embodiments, and may be modified in various ways without departing from the gist of the present disclosure. For example, in the embodiment described above, an example where the present disclosure is applied to the substrate processing system 1 that processes the wafer W with a liquid has been described. However, the application of the present disclosure is not limited to the apparatus that processes the wafer W with a liquid, and the present disclosure may be applied to an apparatus that performs a processing other than the liquid processing.

In addition, the term "section," "module," or "unit" used in the descriptions herein may be replaced with, for example, a "process," "procedure," or "circuit." For example, the correction unit may be replaced with a correcting process, a correcting procedure, or a correction circuit.

According to the present disclosure, even when an actual processing condition deviates from a reference processing condition, a substrate may be processed as desired.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A device for controlling a substrate processing apparatus, the device comprising:
    a memory; and
    a processor coupled to the memory and configured to:
        read out a reference processing condition including a plurality of parameters for processing a substrate by supplying a processing liquid to a substrate;
        estimate an actual processing condition when the substrate is processed;
        compare the reference processing condition and the actual processing condition with each other to obtain a deviated parameter; and
        correct a processing condition for the substrate based on the deviated parameter obtained by the processor,
    wherein the deviated parameter includes at least one of a processing temperature of the processing liquid supplied to the substrate and an ejection time of the processing liquid supplied to the substrate.

2. The device according to claim 1, wherein the processor estimates the actual processing condition based on an apparatus layout of the substrate processing apparatus.

3. The device according to claim 2, wherein the processor estimates the actual processing condition based on information from a sensor provided in the substrate processing apparatus.

4. The device according to claim 3, wherein the processor corrects a parameter different from the deviated parameter among the plurality of parameters included in the reference processing condition.

5. The device according to claim 4, wherein the processor corrects a temperature or concentration of a processing liquid among the plurality of parameters included in the reference processing condition, when the ejection time of the processing liquid deviates from the actual processing condition.

6. The device according to claim 4, wherein the processor corrects a concentration or processing time of a processing liquid among the plurality of parameters included in the reference processing condition, when the temperature of the processing liquid deviates from the actual processing condition.

7. The device according to claim 1, wherein the processor estimates the actual processing condition based on information from a sensor provided in the substrate processing apparatus.

8. The device according to claim 1, wherein the processor corrects a parameter different from the deviated parameter among the plurality of parameters included in the reference processing condition.

9. The device according to claim 8, wherein the processor corrects a temperature or concentration of a processing liquid among the plurality of parameters included in the reference processing condition, when the ejection time of the processing liquid deviates from the actual processing condition.

10. The device according to claim 8, wherein the processor corrects a concentration or processing time of the processing liquid among the plurality of parameters included in the reference processing condition, when the temperature of the processing liquid deviates from the actual processing condition.

11. A method of controlling a substrate processing apparatus comprising:
    reading out a reference processing condition including a plurality of parameters for processing a substrate by supplying a processing liquid to a substrate;
    estimating an actual processing condition when the substrate is processed;
    comparing the reference processing condition and the actual processing condition with each other to obtain a deviated parameter; and
    correcting a processing condition of the substrate based on the obtained deviated parameter obtained,
    wherein the deviated parameter includes at least one of a processing temperature of the processing liquid supplied to the substrate and an ejection time of the processing liquid supplied to the substrate.

12. The device according to claim 2, wherein the apparatus layout includes positions of a plurality of processing containers relative to a processing liquid supply and a rinsing liquid supply.

13. The device according to claim 1, wherein the deviated parameter includes at least one of concentration of the processing liquid supplied to the substrate and a flow rate of the processing liquid supplied to the substrate.

14. The device according to claim 13, wherein the processor corrects a temperature or processing time of the processing liquid among the plurality of parameters included in the reference processing condition, when the concentration of the processing liquid deviates from the actual processing condition.

15. The device according to claim 13, wherein the processor corrects a temperature or processing time of the processing liquid among the plurality of parameters included in the reference processing condition, when the flow rate of the processing liquid deviates from the actual processing condition.

* * * * *